United States Patent [19]

Yen

[11] Patent Number: 5,168,993
[45] Date of Patent: Dec. 8, 1992

[54] OPTICAL PELLICLE HOLDER

[76] Inventor: Yung-Tsai Yen, 196 Tuscaloosa Ave., Atherton, Calif. 94025

[21] Appl. No.: 749,940

[22] Filed: Aug. 26, 1991

[51] Int. Cl.[5] ............................................. B65D 85/38
[52] U.S. Cl. .................................. 206/316.1; 206/455; 206/334; 206/488
[58] Field of Search .................. 206/316.1, 454, 455, 206/460, 334, 449, 486, 488; 40/156, 157

[56] References Cited

U.S. PATENT DOCUMENTS

| | | | |
|---|---|---|---|
| 3.489,265 | 1/1970 | Puente | 206/455 X |
| 3.532,213 | 10/1970 | Schulz et al. | 206/454 X |
| 3.615,006 | 10/1971 | Freed | 206/454 |
| 3.695,424 | 10/1972 | Cristy et al. | 206/455 |
| 4.470,508 | 9/1984 | Yen | 206/334 |
| 4.511,038 | 4/1985 | Miller et al. | 206/454 |
| 4.549,843 | 10/1985 | Jagusch et al. | 206/334 X |
| 4.697,701 | 10/1987 | Ying | 206/316.1 |
| 4.776,462 | 10/1988 | Kosugi et al. | 206/455 X |
| 5.042,655 | 8/1991 | Beldyk et al. | 206/454 X |

*Primary Examiner*—Paul T. Sewell
*Assistant Examiner*—Jacob K. Ackun, Jr.
*Attorney, Agent, or Firm*—Kolisch, Hartwell, Dickinson, McCormack & Heuser

[57] ABSTRACT

An apparatus for holding an optical pellicle made up of a pellicle frame and a pellicle membrane is provided. The apparatus includes a substantially rigid, planar member having a centrally disposed window for removably receiving an optical pellicle. The inner dimension of the window is only slightly greater than the outer dimension of the pellicle such that a frictioned fit between the planar member and the pellicle is achievable. The planar member includes an inwardly extending shoulder against which the pellicle can be seated. The shoulder extends inwardly no further than the thickness of the pellicle frame. The planar member also includes a biasing portion facing inwardly toward the window for yieldably holding the pellicle in place.

7 Claims, 2 Drawing Sheets

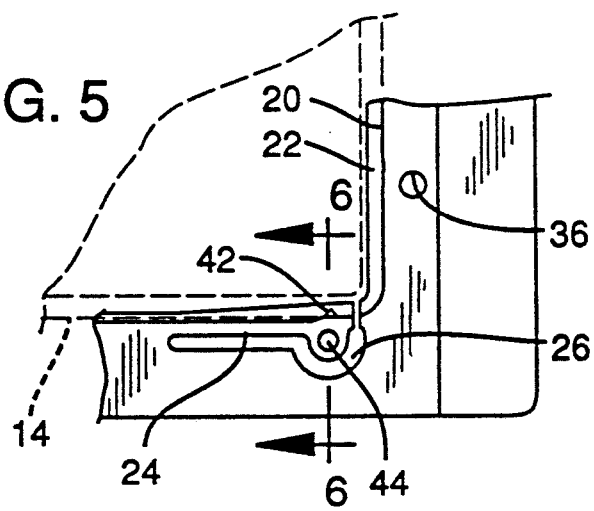
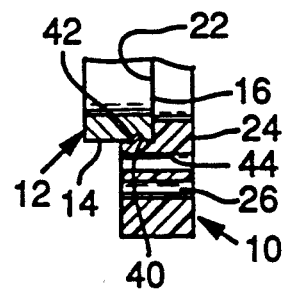
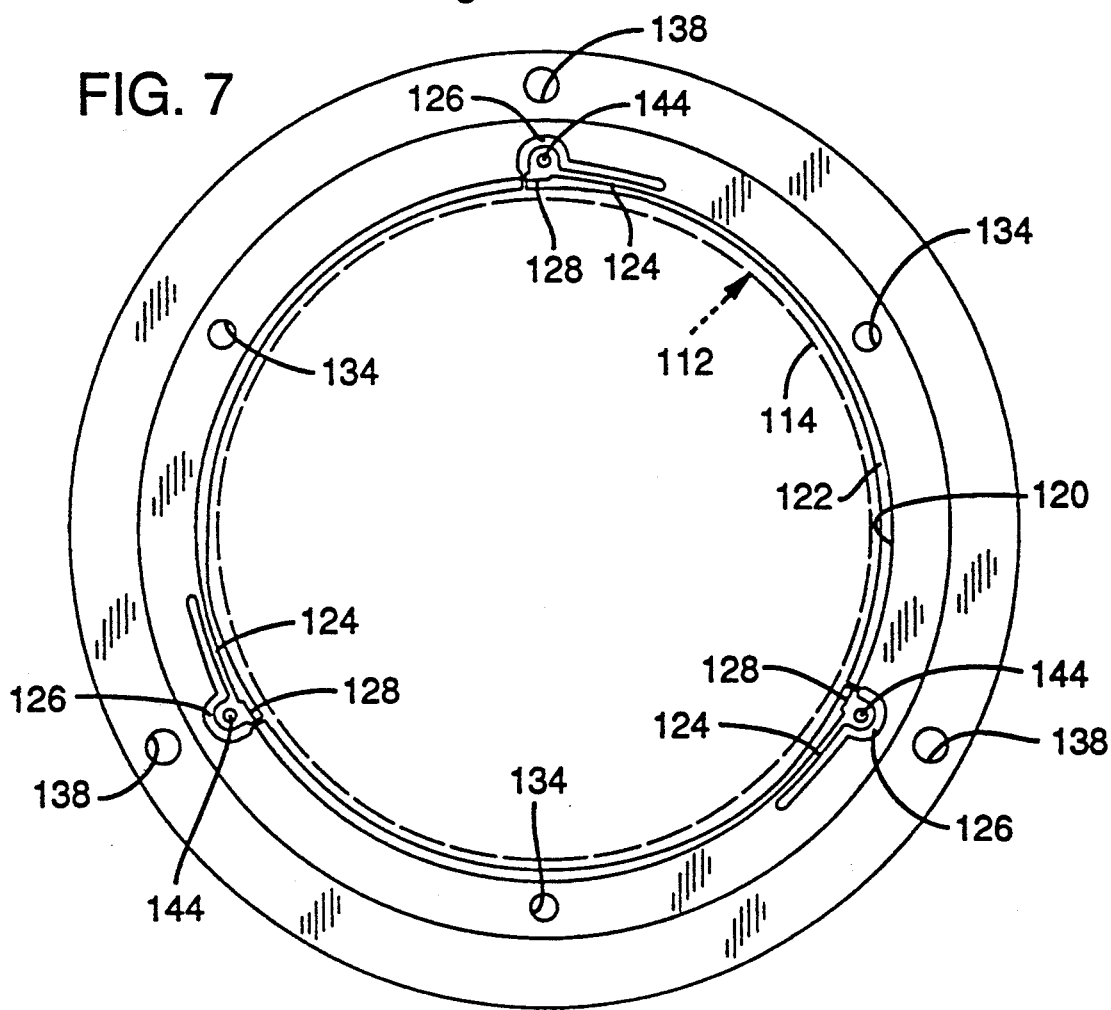

OPTICAL PELLICLE HOLDER

BACKGROUND OF THE INVENTION

This invention relates generally to optical pellicles, and more particularly to a holder for such a pellicle.

Pellicles have played an important role in the fabrication in semiconductor wafers used in integrated semiconductor circuits. As is perhaps best described in U.S. Pat. No. 4,131,363 to Shea et al., an optical pellicle is comprised of a thin transparent membrane which is stretched over a rigid pellicle frame. The pellicle is placed directly onto a photomask such that the membrane is positioned at a distance spaced from the mask. Thus, smaller particulate and dust which falls onto the pellicle membrane is out of focus during the photolithography process, and will not therefore be reproduced in the silicon wafer.

To fabricate a pellicle, a very thin membrane, normally in the range of 0.50 to 3.0 microns, is first formed on a substrate. The membrane is then removed and mounted to a frame on which it is sold. Pellicle frames take many shapes, depending upon the photolithography equipment with which the pellicle is ultimately to be used. After fabrication has been completed, an extensive inspection process takes place. During this inspection process, the pellicle is manually handled and is mounted to various types of inspection machinery. Once inspection has been completed, the pellicle is packaged, in a package such as that described in my U.S. Pat. No. 4,470,508. This package includes shoulders to properly hold the pellicle in place, and typically has an exposed adhesive or piece of double-sided tape to collect any contaminants which might be floating in the air within the package. When the pellicle is to be used, it is manually removed from the package and mounted directly to the photomask with which it is to be used.

While the use of my patented package has been effective in preventing contamination of the pellicle during shipping, because the pellicle must be handled during inspection and mounting to the photomask, there remains a very real possibility of contamination and/or damage to the pellicle membrane during these procedures.

It is therefore a general object of the present invention to provide a system for handling pellicles which overcomes the drawbacks and limitations of prior art proposals. More specifically, the invention has as its objects the following: (1) to provide an optical pellicle handling system which reduces the likelihood of contamination or damage to the pellicle membrane; (2) to develop a holder for an optical pellicle, in which the pellicle can be mounted during fabrication to the inspection processes and reduce direct handling of the pellicle; (3) the provision of a pellicle holder which holds the optical pellicle during fabrication, inspection and shipping, and is usable to facilitate mounting of the pellicle to the photomask; (4) to provide an optical pellicle holder which is simple in construction, and which removably holds an optical pellicle such that mounting to and removal from the holder is a simple procedure which can be performed by one having little training or skill; (5) the development of a pellicle handling apparatus having an integral construction and which can be easily cleaned prior to use with an optical pellicle; (6) to provide an optical pellicle mounting apparatus which is reusable after a simple cleaning operation; (7) to provide a system for handling an optical pellicle which can be easily adapted to a wide variety of shapes and sizes of pellicles; and (8) to provide a pellicle handling system which protects the pellicle during packaging and shipping.

SUMMARY OF THE INVENTION

The present invention best achieves its objects by providing a holder for removably holding an optical pellicle comprised of a pellicle frame and a pellicle membrane. The apparatus includes a substantially rigid, planar member defining a centrally disposed window for removably receiving an optical pellicle. The inner facing dimension of the window is only slightly greater than the outer dimension of the pellicle such that a friction fit between the planar member and the pellicle is achievable. The planar member further includes an inwardly extending shoulder against which the pellicle can be seated, the shoulder extending inwardly no further than the thickness of the pellicle frame. The member also includes a biasing portion facing inwardly toward the window for removably holding the pellicle in place.

Another aspect of the invention is a combination holder and optical pellicle including an optical pellicle and a planar member such as that described above.

Yet another aspect of the invention is a process for using an optical pellicle. The process includes the steps of removably mounting the pellicle to a pellicle holder by deflecting the biasing portion in the holder and pushing the front side of the pellicle into place in the holder such that the rear side of the pellicle is still exposed. The pellicle can then be inspected by holding the pellicle holder. The pellicle is then mounted to a photomask by adhesively affixing the rear side of the pellicle to the photomask. The holder is removed from the pellicle by pulling it off from above.

These and other features and advantages of the present invention will become more fully apparent as this description continues.

BRIEF DESCRIPTION OF THE DRAWINGS

FIG. 5 is a fragmentary plan view of a second embodiment of the present invention, with the inner periphery of the pellicle frame being indicated in phantom;

FIG. 6 is an enlarged, side elevation sectional view of the second embodiment, taken along line 6—6 of FIG. 5; and FIG. 7 is a plan view of a third embodiment of the present invention, with the inner periphery of the pellicle frame being indicated in phantom.

DETAILED DESCRIPTION OF A PREFERRED EMBODIMENT

Figure 1:
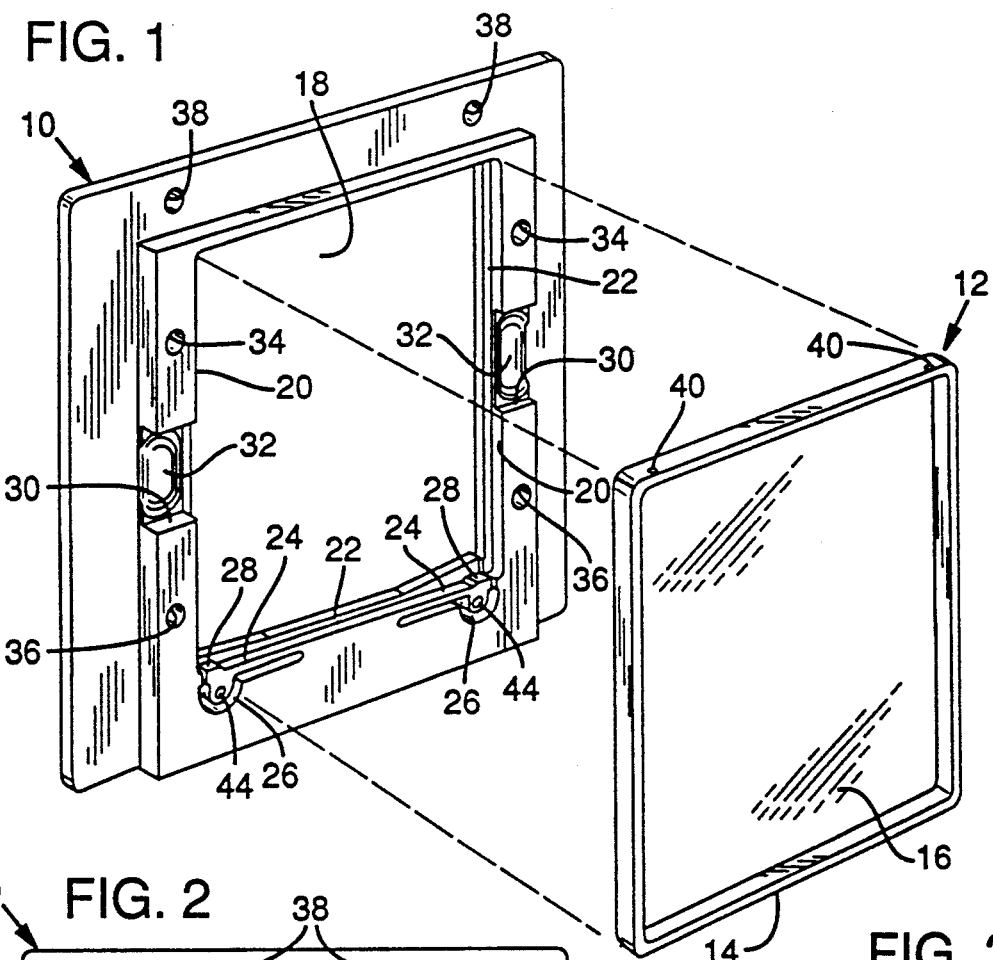
FIG. 1 is a partially exploded, perspective view of a first embodiment of the present invention, showing how the holder receives a pellicle.

Referring now to FIGS. 1-4, indicated generally at 10 is an optical pellicle holder fabricated in accordance with the present invention. The holder 10 is designed to releasably hold a pellicle such as that shown at 12. The pellicle 12 is comprised of a peripheral frame 14 and a membrane 16 (see FIG. 1).

The holder 10, which has been alternately described herein as a planar member, is substantially rigid in its construction, and is normally fabricated of a hard plastic material such as Delrin ® or ABS (acrylonitrile butadiene styrene). The holder 10 is designed to peripherally surround the pellicle, thereby defining a centrally disposed window 18. The window 18 is specifically defined by an inner facing surface 20 which is only slightly greater in its inner dimension than the outer dimension of the pellicle frame 14. The clearance is typically in the range of about 0.005 inch.

Figure 2:
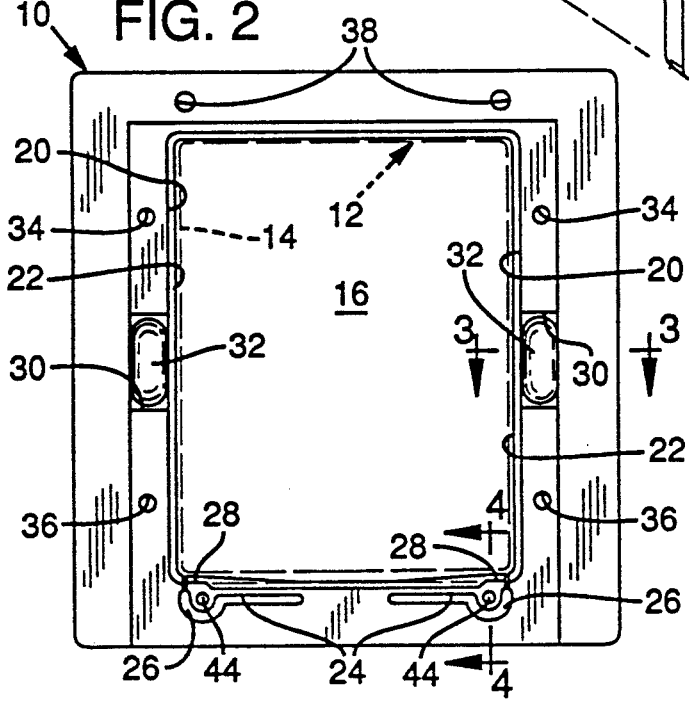
FIG. 2 is a plan view of the embodiment of FIG. 1, with the inner periphery of the pellicle frame being indicated in phantom.
Figure 4:
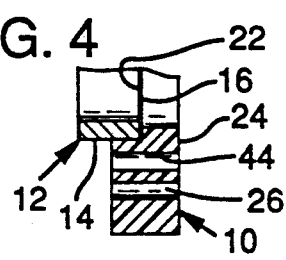
FIG. 4 an enlarged, side elevation sectional view taken along line 4—4 of FIG. 2, except that the pellicle frame has been shown in section.

The holder 10 also includes a peripherally extending shoulder 22 which provides a surface against which the top surface of the pellicle, having a membrane thereon, is placed in abutment. The depth of the shoulder with respect to the inner facing surface 20 is normally less than the depth of the pellicle frame, so that when the pellicle frame is in place, it extends beyond the surface of the inner facing surface, as best depicted in FIG. 4. The shoulder 22 extends inwardly, in the depicted embodiment, a distance which is normally less than the thickness of the pellicle frame 14, as best shown in FIG. 2. This way, the shoulder provides an adequate surface on which to rest the pellicle, but it does not extend so far inwardly as to come into contact with the portion o the membrane 16 which extends inwardly from the pellicle frame.

Figure 3:
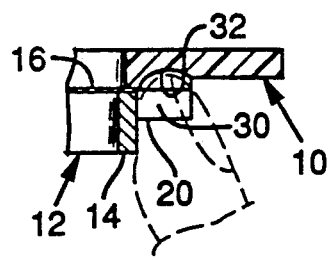
FIG. 3 is an enlarged, side elevation sectional view taken along line 3—3 of FIG. 2, except that the pellicle has been indicated in section; this view also shows, in phantom, an operator's finger being used to grasp the pellicle frame as one might have to to remove the pellicle from the holder.

The holder 10 also includes a system for yieldably engaging the pellicle frame such that it can be removed manually when desired from the holder, as shown in FIG. 3, or can be removed during the process of installing the pellicle onto the photomask. In the depicted embodiment, the system for yieldably holding the pellicle is in the form of a biasing portion including a pair of opposed deflection arms 24 which are defined by elongate apertures 26 in the pellicle holder. The arms extend in opposite directions, and are desirably included along one side of the pellicle frame 14. The arms 24 each include a raised grasping portion 28 which contacts and holds the pellicle in place. Thus, with the pellicle in place, the arms are deflected into apertures 26 due to the raised grasping portions 28 which are pushed outwardly by the outer surface of the pellicle frame 14.

Holes 44 are defined in each of the arms 24. To facilitate placement of a pellicle 12 into holder 10, a pin (not shown) may be placed into each of the holes 44 to cause the arms to be pulled away from the window 18 and toward aperture 26. This can be done manually or with automated equipment.

The holder also includes a pair of opposed cut-out portions 30 which form gaps in the inner facing surface 20 such that a pellicle held within the holder can be manually removed by an operator using his or her fingers, as shown best in FIG. 3. However, it should be understood that during normal operation and use of the holder, such manual removal will not be necessary. It is anticipated that the pellicle will not be removed from the holder once it is engaged thereby until it is actually mounted to the photomask. Mounting to the photomask will normally be possible by merely placing the lower portion of the pellicle directly onto the photomask, and pressing on it. As is understood by those familiar with the operation and features of pellicles, the lower surface of the pellicle normally has adhesive thereon to provide proper adherence and sealing with the photomask.

The depth of the cut-out portions normally approximates that of the shoulder 22, shown best in FIG. 3, although rounded out portions are provided at 32 to ease the manual removal process.

The holder is also provided with pairs of opposed holes 34 and 36 which may be used as guides during mounting of the pellicle to the photomask. Thus, by using alignment pegs or other similar guides, precise mounting is possible, again without actually handling the pellicle itself. These alignment holes 34 and 36 may also be used during pellicle inspection immediately following the fabrication. Two additional holes 38 are provided in the depicted embodiment for additional alignment capability or to permit the pellicle to be hung from suitable brackets while in its holder.

USE OF THE EMBODIMENT OF FIGS. 1-4

As mentioned previously, the holder 10 may be used to hold a pellicle during post-fabrication inspection processes. In order to mount a pellicle in holder 10, the holder is typically placed on a jig (not shown) having a pair of inclined pegs which pass through holes 44 in arms 24. As the holder is pressed down onto the jig, the incline of the pegs causes the arms to be pulled away from window 18 to make room for the pellicle 12. The pellicle can then be merely dropped into place and the holder can be removed from the jig. This releases the arms, thus engaging the pellicle.

Alternatively, assuming that the pellicle has already been fabricated and is being held in position on a fabrication table, the holder may simply be lowered onto the pellicle with the side having deflection arms 24 coming into contact first. The pellicle frame 14 is used to push grasping portions 28 downwardly into their respective apertures 26, and the rest of the holder is merely pushed into place. Thus, the pellicle is adequately grasped by the holder, without requiring the operator to actually handle the pellicle itself.

With the pellicle engaged, the operator can lift up the pellicle and handle it during inspection operations by merely holding onto one side or corner of the holder 10. If mounting to inspection equipment is necessary, guide holes 34 and 36 can be used to precisely position the pellicle. Also, the configuration of holder 10 makes it far easier to use automatic equipment or robotics to handle the pellicle.

In order to ship the product, a modified container manufactured generally in accordance with my U.S. Pat. No. 4,470,508, can be used. Because even the peripheral edge of the pellicle membrane 16 no longer has to rest on a surface of the package, the possibility of damage to the membrane is reduced.

At the chip manufacturing facility, the pellicle is removed from the package by merely grasping the holder 10. The holder with the pellicle therein can be aligned in conventional lithography equipment through the use of holes 34 and 36 or can merely be mounted in place through a manual operation. In any event, it is not necessary to directly handle the pellicle. Once the adhesive-coated underside of the pellicle frame 14 is applied to the photomask, holder 10 can merely be withdrawn, and the adhesion between the pellicle frame and the photomask will cause removal of the pellicle from the holder. A pair of indentations 40 are normally formed in each outer side of the pellicle frame, to permit the pellicle to be held in place on the photomask during removal of the holder. The position of the indentations with respect to the depth of the shoulder 22 is such that the indentations remain exposed when the pellicle is held by the holder 10.

EMBODIMENT OF FIGS. 5 AND 6

The embodiment of FIGS. 5 and 6 is identical to the embodiment of FIGS. 1-4 except that it includes a generally conical prong 42 in place of grasping portion 28. Because all other portions of this embodiment are the same as the prior embodiment, the same identification numerals have been used. This pronged embodiment is helpful in instances where the pellicle must be grasped more firmly, and in many applications will be preferred to that of FIGS. 1-4. In some applications it may be desirable to coat one or both surfaces of the prong and its femal receptor, in order to cut down on particulates. Such coating might be in the form of a soft or resilient material such as silicon, or might be an adhesive material such as a water based acrylic.

In the embodiments of FIGS. 5-6, the pellicle will normally have a pair of drilled indentations 40, but the indentations will be positioned lower than as depicted in FIG. 1. Specifically, it can be seen in FIG. 6 that the indentations are positioned in the lower half of the pellicle, or the half of the pellicle which is engaged by the holder 10. FIG. 6 has been simplified for purposes of illustration to indicated that membrane 16 is a solid line. However, it should be understood that the membrane does in fact have a minimal thickness, as shown in FIGS. 3-4.

THE EMBODIMENT OF FIG. 7

The embodiment of FIG. 7 is similar to that of FIGS. 1-4 except that it is designed to be used with a round pellicle. As mentioned previously, pellicles come in many different sizes and shapes, depending upon the photolithography equipment with which they are to be used. FIG. 7 includes an inner facing surface 120, a peripherally extending shoulder 122, three equally spaced arms 124 defined by apertures 126, grasping portions 128, and alignment holes 134 and 138. Opposed cutout portions having rounded out areas may also be provided corresponding to portions 30 and 32 of the embodiment of FIGS. 1-4. Holes 144 are provided in each of the arms 124 to permit the arms to be retracted using an automated system such as a jig, as described earlier with respect to the embodiment of FIGS. 1-4.

In certain applications, it may be desirable to include conical members (not shown in FIG. 7) which correspond to members 42 of the embodiment of FIGS. 5 and 6 where the pellicle needs to be grasped with greater holding power.

The invention may be adapted to other shapes and sizes of pellicles, as desired. The present invention enables the fabrication of a holder for each such pellicle. It should be understood that these and other variations and modifications of the depicted embodiment may be made without departing from the spirit and scope of the present invention. Those variations and modifications are intended to be covered by the following claims.

It is claimed and desired to secure by Letters Patent:

1. An apparatus for holding an optical pellicle made up of a pellicle frame and a pellicle membrane, the apparatus comprising:
   a substantially rigid, planar member defining a centrally disposed window for removably receiving an optical pellicle, the inner dimension of the window being only slightly greater than the outer dimension of the pellicle such that a frictioned fit between the planar member and the pellicle is achievable;
   the planar member including an inwardly extending shoulder against which the pellicle can be seated, the shoulder extending inwardly no further than the thickness of the pellicle frame;
   the planar member further including a biasing portion facing inwardly toward the window for yieldably holding the pellicle in place.

2. The apparatus of claim 1 wherein the planar member has a pair of opposed cut-out portions which reveal the pellicle frame from the outer side thereof, to permit the pellicle frame to be grasped for removal purposes.

3. The apparatus of claim 1, further defining at least a pair of opposed alignment holes disposed outwardly of the window to permit the apparatus and a pellicle held thereby to be precisely mounted in place.

4. The apparatus of claim 1 wherein the biasing portion comprises a pair of resilient arms extending in a direction generally parallel to the pellicle frame to be in contact therewith, but biased slightly inwardly to hold the pellicle in the apparatus.

5. The apparatus of claim 4 wherein the resilient arms comprise an integral part of the planar member.

6. A holder-mounted optical pellicle comprising:
   an optical pellicle including a membrane and a peripheral frame; and
   an alignment holder in the form of a substantially rigid, planar member, defining a centrally disposed window for removably receiving the pellicle, the inner dimension of the window being only slightly greater than the outer dimension of the pellicle frame such that a friction fit exists between the planar member and the pellicle frame, the planar member including an inwardly extending shoulder against which the pellicle can be seated, the shoulder extending inwardly no further than the thickness of the pellicle frame so that the planar member does not extend over the membrane which extends inwardly from the pellicle frame, the planar member further including a resilient portion facing and in contact with the outer portion of the pellicle frame for yieldably holding the pellicle in place.

7. The apparatus of claim 6 wherein the biasing portion comprises a pair of resilient arms extending in a direction generally parallel to the pellicle frame in contact therewith, but biasing slightly inwardly to hold the pellicle in the holder, the resilient arms comprising an integral part of the planar member.

* * * * *